US009112477B2

(12) United States Patent
Bahriz et al.

(10) Patent No.: US 9,112,477 B2
(45) Date of Patent: Aug. 18, 2015

(54) MODULE FOR THE MECHANICAL UNCOUPLING OF A RESONATOR HAVING A HIGH QUALITY FACTOR

(75) Inventors: Michael Bahriz, La Chapelle Rablais (FR); Olivier Le Traon, Vauhallan (FR)

(73) Assignee: Office National D'Etudes Et de Recherches Aerospatiales (Onera), Chatillon (FR)

(*) Notice: Subject to any disclaimer, the term of this patent is extended or adjusted under 35 U.S.C. 154(b) by 402 days.

(21) Appl. No.: 13/808,562

(22) PCT Filed: Jul. 4, 2011

(86) PCT No.: PCT/FR2011/000389
§ 371 (c)(1),
(2), (4) Date: Feb. 12, 2013

(87) PCT Pub. No.: WO2012/004469
PCT Pub. Date: Jan. 12, 2012

(65) Prior Publication Data
US 2014/0145793 A1 May 29, 2014

(30) Foreign Application Priority Data
Jul. 6, 2010 (FR) .................................... 10 02829

(51) Int. Cl.
*H01L 41/09* (2006.01)
*H03B 5/30* (2006.01)
(Continued)

(52) U.S. Cl.
CPC ... *H03H 9/2405* (2013.01); *H03H 2009/02503* (2013.01)

(58) Field of Classification Search
CPC .................. H03H 3/0072; H03H 2009/02496; H03L 1/022; H03B 17/00

USPC .......... 310/311, 324, 328, 367, 370; 331/154, 331/155, 158, 159
See application file for complete search history.

(56) References Cited

U.S. PATENT DOCUMENTS 3,168,623 A * 2/1965 Petermann .................... 369/144
3,617,780 A * 11/1971 Benjaminson et al. ........ 310/344
(Continued)

FOREIGN PATENT DOCUMENTS

DE 2148064 A1 4/1973
FR 2338607 8/1977
JP 2008-259100 A 10/2008

OTHER PUBLICATIONS

Buser et al., "Very high Q-factor resonators in monocrystalline silicon". Sensors and Actuators A, vol. 21, No. 1-3, Feb. 1, 1990, pp. 323-327 (On Order).
(Continued)

*Primary Examiner* — Thomas Dougherty
(74) *Attorney, Agent, or Firm* — Christie, Parker & Hale, LLP

(57) ABSTRACT

The device (10) comprises a cylindrical resonator (R) vibrating in extension-compression along its longitudinal axis (Δ) and having a vibration node (N) in its mid-plane (π), the vibration naturally generating radial extension/compression deformations, and a mechanical decoupling module comprising a hollow cylinder (2) surrounding the resonator and a membrane (1) positioned in the aforementioned mid-plane and rigidly connected to the cylindrical surface of the resonator and to the internal cylindrical surface of the hollow cylinder. The hollow cylinder vibrates in extension/compression in antiphase with the vibration of the resonator, enabling the effects of the radial deformations of the hollow cylinder and of the resonator to compensate each other in an area (ZF) located on the external surface of the hollow cylinder close to the mid-plane.

7 Claims, 4 Drawing Sheets

(51) Int. Cl.
*H03H 9/24* (2006.01)
*H03H 9/02* (2006.01)

(56) References Cited

U.S. PATENT DOCUMENTS

| | | | |
|---|---|---|---|
| 4,135,108 A | | 1/1979 | Besson |
| 4,381,471 A | | 4/1983 | Filler et al. |
| RE31,722 E | * | 11/1984 | Steinberger ............... 84/327 |
| 4,562,375 A | * | 12/1985 | Besson et al. ............. 310/338 |
| 2007/0216496 A1 | | 9/2007 | Nakanishi et al. |
| 2011/0075521 A1 | * | 3/2011 | Hama ........................ 367/160 |

OTHER PUBLICATIONS

Mattila et al., "A 12 MHz micromechanical bulk acoustic mode oscillator". Sensors and Actuators A, vol. 101, No. 1-2, Sep. 30, 2002, pp. 1-9 (On Order).

International Search Report mailed Nov. 17, 2011, for International Application No. PCT/FR2011/000389, 4 pages.

* cited by examiner

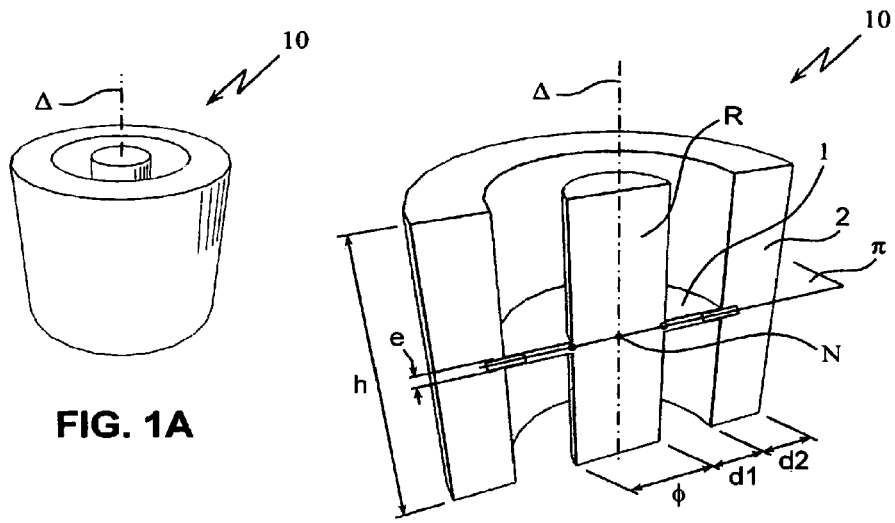
FIG. 1A
FIG. 1B
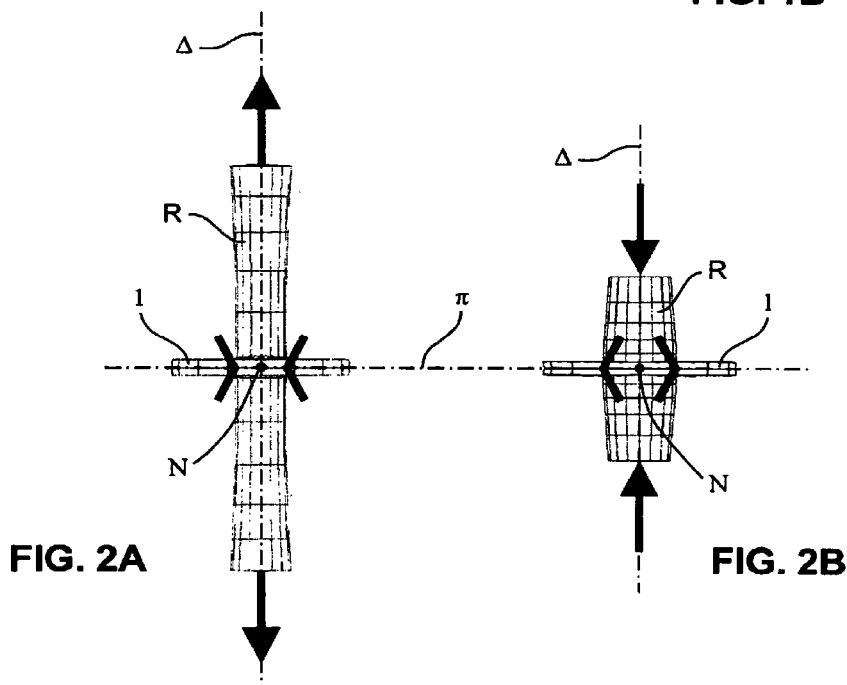
FIG. 2A
FIG. 2B

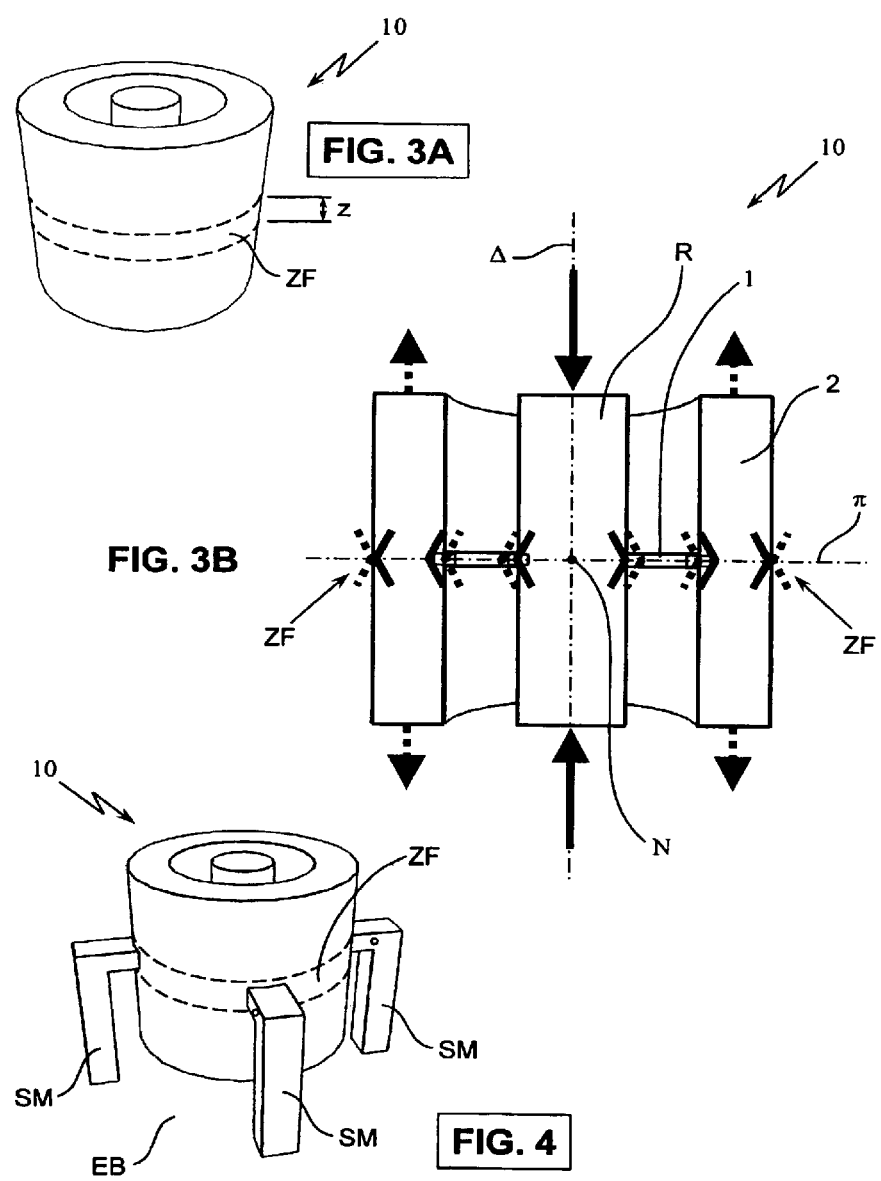

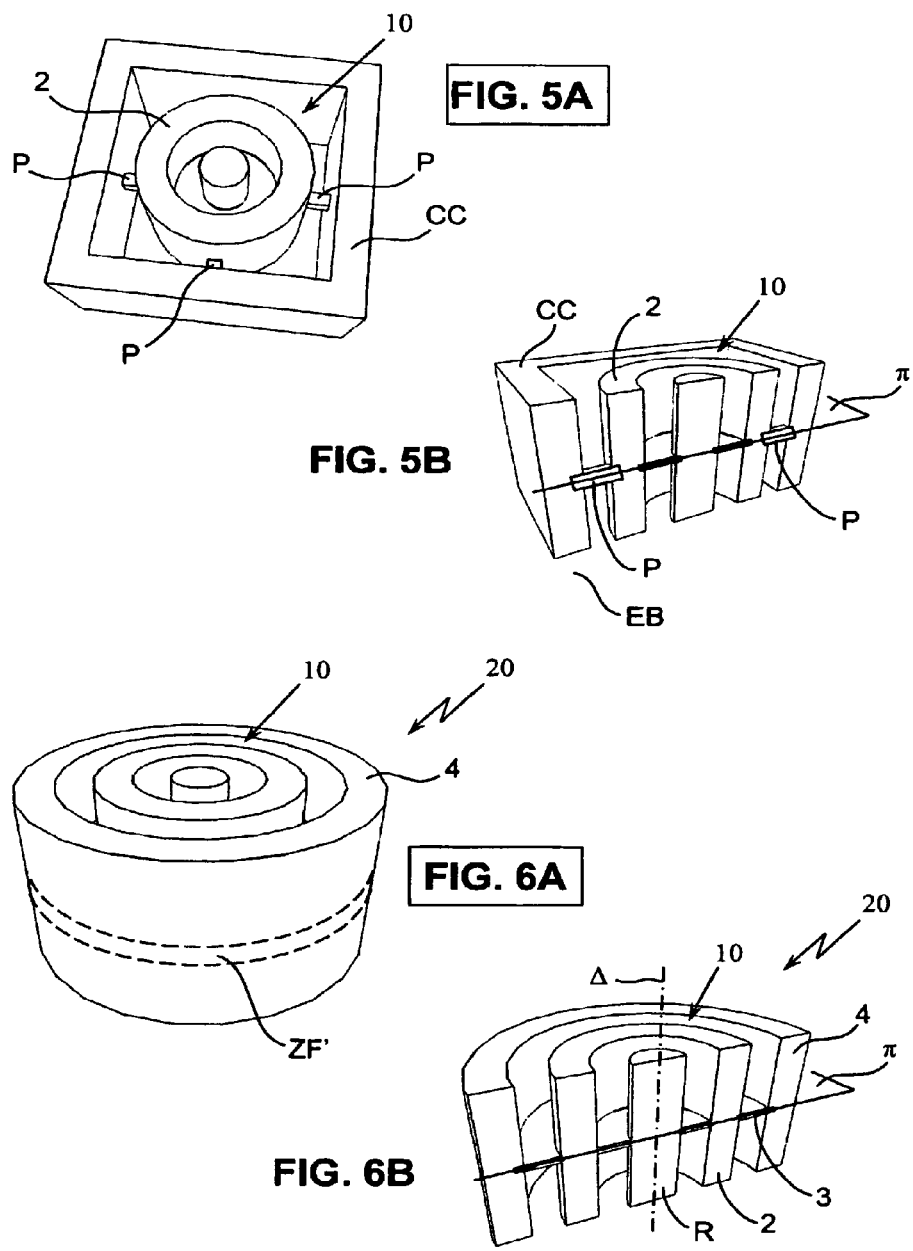

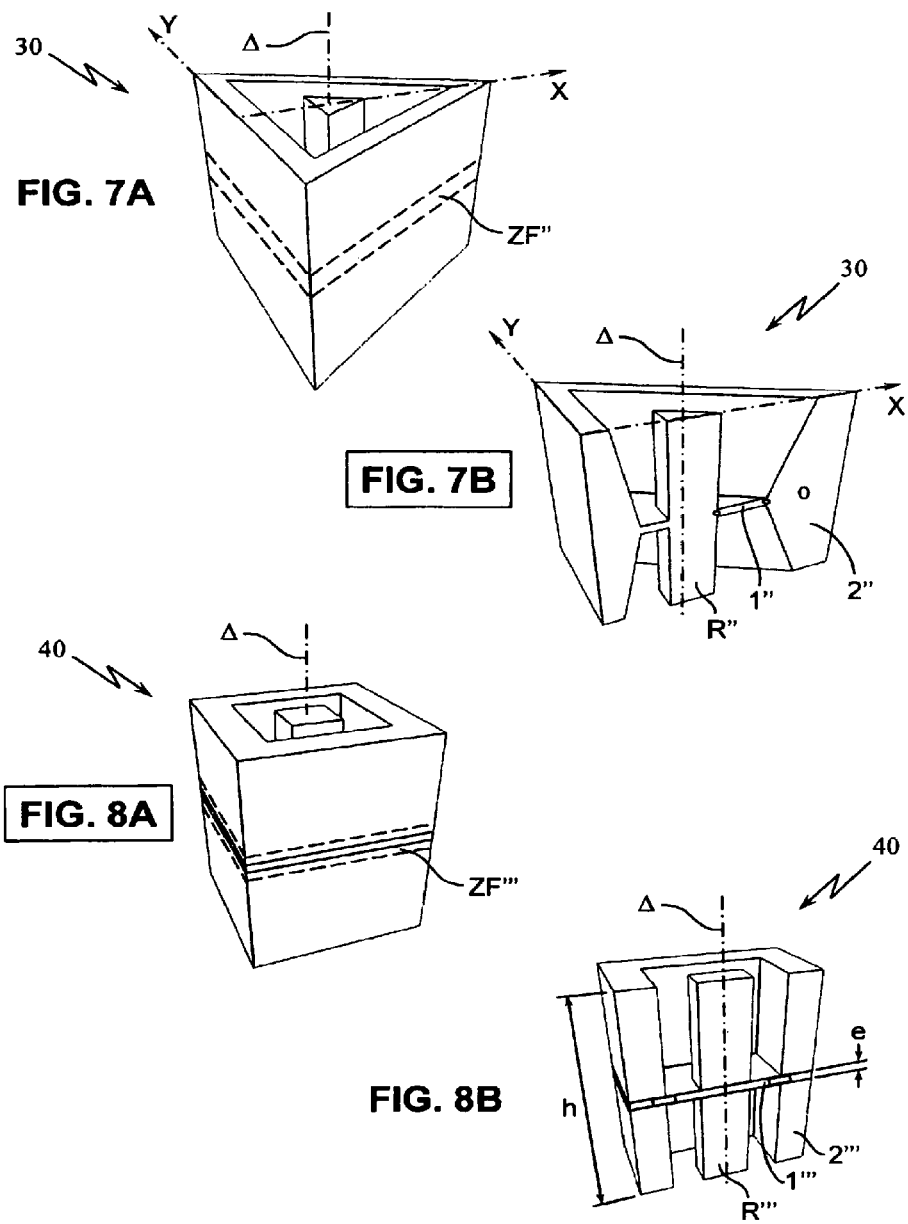

MODULE FOR THE MECHANICAL UNCOUPLING OF A RESONATOR HAVING A HIGH QUALITY FACTOR

CROSS-REFERENCE TO RELATED APPLICATION

This application is a National Phase Patent Application and claims priority to and benefit of International Application Number PCT/FR2011/000389, filed on Jul. 4, 2011, which claims priority to and benefit of French Patent Application Number 10/02829, filed on Jul. 6, 2010, the entire disclosures of which are incorporated herein by reference.

The invention relates to the field of mechanical resonators used for constructing instruments for measuring time or frequency.

More specifically, the invention relates to a module for the mechanical decoupling of a resonator having a high quality factor, intended for use in highly stable clocks called "ultra-stable oscillators" (USOs).

A USO is composed of a mechanical resonator of this type and an electronic oscillator circuit which enables the vibration of the resonator to be kept at its mechanical resonance frequency. Thus the stability of the frequency of the alternating electrical signal present in the electronic circuit benefits from the stability of the frequency of the mechanical resonance of the resonator, which is generally much greater than that of a purely electronic oscillator circuit.

The stability of the resonant frequency of the mechanical resonator increases with the quality factor of the resonant vibration; in other words, the vibration energy contained in the resonator is large relative to the energy lost per vibration period. There are two types of energy loss, which are, on the one hand, the intrinsic losses, due for example to the viscous damping of the material from which the resonator is made, and, on the other hand, the extrinsic losses due to gas damping or to unsuitable fixing of the resonator, for example. Because of this, the best resonators are made from materials having very low viscous damping, such as quartz; they are also packaged in casings in a vacuum, and are attached in each casing at a location which is referred to by the accepted theoretical term "vibration node".

There is a practical formulation for expressing the contribution of the different sources of energy loss, as explained below.

The expression for the actual quality factor of the resonator is written thus:

$$Q \text{ actual}=2\pi \cdot E/\Delta E$$

where E is the energy contained in the resonator and $\Delta E$ is the energy lost per vibration period. For the aforementioned examples, $\Delta E$ can be written thus:

$$\Delta E = \Delta E \text{ intrinsic} + \Delta E \text{ gas} + \Delta E \text{ attachment}$$

Therefore we can write:

$$1/Q \text{ actual}=(\Delta E \text{ intrinsic}+\Delta E \text{ gas}+\Delta E \text{ attachment})/2\pi \cdot E$$

Therefore, $$1/Q \text{ actual}=\Delta E \text{ intrinsic}/2\pi \cdot E+\Delta E \text{ gas}/2\pi \cdot E+\Delta E \text{ attachment}/2\pi \cdot E$$

Thus we can associate each source of energy losses with its own quality factor, and we can write:

$$1/Q \text{ actual}=1/Q \text{ intrinsic}+1/Q \text{ gas}+1/Q \text{ attachment}$$

In order for the actual quality factor of the resonator to be close to its intrinsic quality factor, therefore, the quality factors associated with the various sources of extrinsic losses must be much greater than the intrinsic quality factor. For example, if Q intrinsic is about $10^6$, Q attachment and Q gas are preferably at least $10^7$ or thereabouts.

The invention relates in particular to the losses caused by the attachment of the resonator, and is intended to ensure that Q attachment is much greater than Q intrinsic.

The attachment of a resonator at the location of a vibration node is a concept which is easily understood in the textbook case of a point attachment and a resonator model having a single spatial dimension. However, in the real case of a resonator in three dimensions, to be located in an attachment area which inevitably has non-zero dimensions, the problem is generally difficult to resolve, and requires the use of a mechanical decoupling module. This mechanical decoupling module is an integral part of a device incorporating the resonator. It must be made from a material with very low viscous damping and must allow the device to have an area which is sufficiently decoupled from the mechanical vibration of the resonator. Thus, the attachment of this area in the casing does not adversely affect the quality factor of the resonator. This attachment area can be considered as a vibration node of the device. Evidently, a higher intrinsic quality of the resonator will require a greater efficiency of the decoupling module.

For resonators with high quality factors to be used in USOs, there is a known way of making a device which is monolithic, is formed by a quartz blank vibrating in thickness-shear mode, and is attached at its edge (U.S. Pat. No. 4,381,471). One face of the blank is flat and the other face is convex, such that the vibration energy is located primarily in the central region of the blank (the thickest region) and fades progressively until it disappears completely at the edge. Thus the central region of the blank can be considered to be the resonator, with the edge forming the attachment area, and the rest of the blank being the mechanical decoupling module. Metal electrodes deposited on the main faces of the blank in the central region are used to excite the vibration of the resonator by a piezoelectric effect. It should be noted that this device also operates in thickness extension/compression mode, according to the same operating principle of the mechanical decoupling resulting from the convexity of one of the faces of the blank.

This known prior art device operates remarkably well because it provides mechanical decoupling which is effective enough to prevent any alteration of the high intrinsic quality factor of the resonator. This known device is generally attached by means of metal supports, each having one end mounted on the edge of the blank and the other end mounted on a sealed cross-piece of the casing, thus facilitating the electrical connection between the sealed cross-pieces of the casing and the metal electrodes deposited on the blank.

There is also a known way of removing material near the edge of the blank so that the device has a peripheral ring connected by links to a central blank which is smaller than the original blank, and reducing the thickness of these links in the dimension of the thickness of the blank (Patent FR 2 338 607 or its equivalent U.S. Pat. No. 4,135,108). This device is attached by its peripheral ring, thus protecting the central blank from parasitic effects, due for example to heat or to the presence of an acceleration field. On the other hand, the ring and links make no contribution to the mechanical decoupling of the vibration of the resonator, since the mechanical decoupling is again provided by the convexity of one of the faces of the blank.

However, these known devices have a drawback in that it is difficult to form the convex face of the blank with sufficient precision, notably as regards conformity with the precise value of the optimal radius of curvature. Because of this requirement, therefore, each blank produced must be subjected to an inspection and refinishing procedure, resulting in high manufacturing costs.

The object of the invention is, notably, to overcome the drawbacks of the prior art by proposing a device including a mechanical decoupling module which is equally effective but can be produced by an inexpensive machining process.

To this end, the device including a resonator and a mechanical decoupling module, in which the resonator is formed by a right cylinder vibrating in extension/compression mode along its central longitudinal axis and having a vibration node in its mid-plane which is perpendicular to the longitudinal axis, and in which the vibration naturally induces radial extension/compression deformations, is characterized in that the decoupling module includes a hollow right cylinder surrounding and spaced apart from the resonator and having its central longitudinal axis and its mid-plane coinciding with those of the resonator, and a membrane positioned in the mid-plane and rigidly connected to the cylindrical surface of the resonator and with the internal cylindrical surface of the hollow cylinder, and in that the hollow cylinder vibrates in an extension/compression mode along its longitudinal axis in antiphase with the vibration of the resonator, as a result of which the effects of the radial deformations of the hollow cylinder and of the resonator compensate each other in an area located on the external surface of the hollow cylinder close to the mid-plane.

The simultaneous vibrations in antiphase of the resonator and of the hollow cylinder correspond to a specific mechanical resonance mode of the device according to the invention, a condition of the existence of this mode being that the heights of the resonator and the hollow cylinder are substantially the same.

Thus, the aforesaid area located on the external surface of the hollow cylinder may be decoupled from the vibration of the resonator, and by attaching the device to this area the actual quality factor of the resonator may be brought close to its high intrinsic quality factor. In order to achieve maximum decoupling, the design of the device is optimized, for example by digital simulation based on the finite element method.

The device may also be formed from a flat plate of material in which the thickness dimension lies on the longitudinal axis of the resonator, by means of inexpensive machining carried out on both faces of the plate to provide a depth corresponding to the membrane. For example, the device is formed by combined chemical machining of a quartz plate by a method similar to that used in the clockmaking industry for manufacturing quartz crystals for watches.

The features and advantages of the invention will become clear from the detailed description and the drawings relating thereto, in which:

FIG. 1A is a perspective view of a monolithic device according to a first embodiment of the invention, suitable for an isotropic material;

FIG. 1B is a perspective view in longitudinal section of the device of FIG. 1A;

FIGS. 2A and 2B show exaggeratedly magnified deformations of the vibrating resonator, to illustrate how the extension/compression vibration of the resonator along its longitudinal axis naturally induces radial extension/compression deformations called Poisson effects;

FIG. 3A is a view similar to FIG. 1A, showing the attachment area of the device;

FIG. 3B is a view similar to FIG. 1B, showing the longitudinal movements of the resonator and of the hollow cylinder, together with the associated Poisson effects;

FIG. 4 shows a way of holding the device of FIG. 3A, using metal supports;

FIGS. 5A and 5B show a way of holding the device of FIG. 3A, using an integrated attachment system;

FIGS. 6A and 6B show a monolithic device according to a second embodiment of the invention, comprising an additional hollow cylinder surrounding and spaced apart from the aforesaid hollow cylinder and intended to enable the effectiveness of the mechanical decoupling module to be maintained with higher manufacturing tolerances;

FIGS. 7A and 7B show a monolithic device according to a third embodiment of the invention, suitable for quartz; and FIGS. 8A and 8B show a non-monolithic device according to a fourth embodiment of the invention, suitable for silicon.

Reference will be made initially to FIG. 1A, which shows a perspective view of a device 10 according to the invention, and to FIG. 1B which shows a perspective view in longitudinal section of FIG. 1A. The device 10 includes a resonator R formed by a right cylinder with a circular directrix and a central longitudinal axis 4, which is symmetrical about a mid-plane n perpendicular to the longitudinal axis; a right hollow cylinder 2 with circular directrices, surrounding and spaced apart from the resonator and having its central longitudinal axis and its mid-plane coinciding with those of the resonator; and a membrane 1 positioned in the aforementioned mid-plane and rigidly connected to the cylindrical surface of the resonator and to the internal cylindrical surface of the hollow cylinder.

The hollow cylinder 2 and the membrane 1 form the mechanical decoupling module of the device 10.

In the illustration, the resonator R and the hollow cylinder 2 have the same height dimension h. It is important for the operation of the device that the resonator R and the hollow cylinder 2 have substantially the same height, as explained below.

The symbol $\Phi$ denotes the diameter of the resonator R; d1 and e denote, respectively, the radial dimension and thickness of the membrane 1; and d2 denotes the thickness of the wall of the hollow cylinder 2, in other words the difference between its external radius and its internal radius.

The device 10 is monolithic and is made from a flat plate of isotropic material having very low viscous damping, such as silica. The thickness dimension of the plate lies on the longitudinal axis $\Delta$ of the resonator and is equal to the aforesaid height h. The device 10 is formed, for example, by plasma machining on both faces of the plate, until a depth corresponding to the membrane is reached.

The operation of the device according to the invention will now be explained with reference to FIGS. 2A, 2B, 3A and 3B.

FIGS. 2A and 2B are views in longitudinal section of the resonator R and the membrane 1 of FIG. 1B, and show exaggeratedly magnified deformations of the resonator vibrating alternately in extension (FIG. 2A) and in compression (FIG. 2B) along its longitudinal axis A and having a vibration node N in its mid-plane n. The extension/compression vibration naturally induces radial extension/compression deformations due to the Poisson coefficient of the material, these radial deformations being maximal in the mid-plane n and zero at the ends of the resonator. Thus the vibration of the resonator has only one vibration node (N) located on the longitudinal axis A, in other words at the core of the resonator material. In these drawings, the longitudinal deformations are indicated by vector arrows and the radial deformations are indicated by V-shaped arrows.

To ensure that the extension/compression vibration of the resonator along its longitudinal axis is sufficiently pure, or in other words that the cross sections of the resonator undergo, for practical purposes, only the aforementioned longitudinal translations and radial deformations, the height h of the resonator must be markedly greater than its diameter Φ. Preferably, the height h is between three times and ten times the diameter Φ.

The positioning of the membrane 1 in the mid-plane n is advantageous in respect of the deformations of the resonator along its longitudinal axis, because it allows the membrane to remain in the mid-plane during the vibration of the resonator, but the radial alternating extension and compression deformations of the resonator in the mid-plane π act directly on the membrane 1 and cause, in particular, alternating variations of its external diameter.

In other words, it would not be advantageous for the membrane 1 to be attached directly in the casing, because this would lead to losses of the vibration energy of the resonator. However, the positioning of the membrane 1 in the mid-plane n can be considered to be a major advantage in respect of the mechanical decoupling of the vibration of the resonator. It should be noted that this remark is meaningful only if the thickness e of the membrane is sufficiently small with respect to the height h of the resonator. Preferably, the thickness e is less than a twentieth of the height h. It is also important for the radial dimension d1 of the membrane not to be too large with respect to its thickness e, in order to ensure that parasitic modes of mechanical resonance of the membrane do not disturb the operation of the device according to the invention. Preferably, the dimension d1 is not more than twenty times the thickness e.

With reference to FIGS. 3B and 3A, it will now be explained how the hollow cylinder 2 surrounding the resonator R can provide excellent mechanical decoupling of the vibration of the resonator. FIG. 3B is a view similar to FIG. 1B, in which arrows are used to indicate the longitudinal deformations of the resonator and of the hollow cylinder 2, together with the associated radial deformations, when the resonator R is in resonant vibration. The arrows corresponding to the hollow cylinder are shown in broken lines. The hollow cylinder vibrates in an extension/compression mode along its longitudinal axis in antiphase with the vibration of the resonator. It must be emphasized that the simultaneous vibrations in antiphase of the resonator and of the hollow cylinder correspond to a specific mechanical resonance mode of the device according to the invention, acting in a rather similar way to the simultaneous vibrations in antiphase of the two substantially identical prongs of a tuning fork in resonant vibration. For the device according to the invention, a condition of the existence of the specific resonance mode is that the heights of the resonator R and the hollow cylinder 2 are substantially the same, as a result of which the resonant extension/compression vibrations of the resonator and of the hollow cylinder considered separately have similar frequencies. If this condition is met, the membrane 1 rigidly connected to these two elements provides strong mechanical coupling between their vibrations, rather as does the base rigidly connected to the two prongs of a tuning fork, thus enabling the aforesaid specific resonance mode to exist.

Whereas the two substantially identical prongs of a tuning fork have substantially identical amplitudes of vibration, the amplitudes of vibration of the resonator R and of the hollow cylinder 2 of the device according to the invention are generally very different from each other, because the mass of the hollow cylinder is generally much greater than that of the resonator. Consequently the amplitude of vibration of the hollow cylinder is generally very much lower than that of the resonator, thereby naturally balancing the quantities of movement present in the specific resonance mode of the device according to the invention. The reader will have noted that the radial dimensions of the hollow cylinder, particularly its wall thickness d2, are dimensional parameters which can be used to adjust the ratio between the amplitude of vibration of the hollow cylinder and that of the resonator to a certain extent, without affecting the existence of the specific resonance mode of the device. This freedom of action is exploited profitably in the device according to the invention, as explained below.

With reference to FIG. 3B again, the longitudinal deformations of the hollow cylinder induce radial deformations of its wall. More precisely, a longitudinal extension induces a compression of the wall thickness d2, and a longitudinal compression induces an extension of the thickness d2. In both cases, this causes opposing radial movements on the external and internal cylindrical surfaces of the hollow cylinder respectively, making it possible to obtain two specific qualities of the device according to the invention.

The first quality is due to the fact that the radial movements of the internal cylindrical surface of the hollow cylinder are in the same direction as those of the cylindrical surface of the resonator, which contributes to the creation, through the intermediary of the membrane 1, of the aforesaid strong mechanical coupling between the vibrations of the resonator and those of the hollow cylinder.

The second quality of the device according to the invention is due to the fact that, on the external cylindrical surface of the hollow cylinder, the radial movements due to the radial deformations of the hollow cylinder are in the opposite direction to those due to the radial deformations of the resonator, thus enabling their effects to be compensated in an area located on the external surface of the hollow cylinder close to the mid-plane n. Thus, the aforesaid area may be virtually decoupled from the vibration of the resonator, and by attaching the device to this area the actual quality factor of the resonator may be brought close to its high intrinsic quality factor. This area, called the attachment area, is denoted ZF and is delimited by broken lines in FIG. 3A. The attachment area ZF is a cylindrical surface with a height z, having the same mid-plane (n) as the resonator and the hollow cylinder. The height z is generally greater than the thickness e of the membrane 1. For example, the height z may be equal to twice the thickness e, which is relatively convenient for the positioning of an attachment system on the area ZF, as described below. In order to achieve maximum decoupling of the area ZF in respect of the vibration of the resonator, the design of the device according to the invention is optimized, for example by means of digital simulations based on the finite element method. The Poisson effects due to the hollow cylinder and to the resonator may be compensated virtually entirely by adjusting the longitudinal amplitude of vibration of the hollow cylinder, since the Poisson effects due to the hollow cylinder are proportional to this amplitude. As mentioned above, this adjustment can be carried out by varying the mass of the hollow cylinder, for example by varying its wall thickness d2. In the illustration, the radial dimension d2 is of the same order of magnitude as the diameter Φ of the resonator. More generally, the radial dimension d2 is preferably between half the diameter Φ and twice the diameter Φ.

We have now explained the mechanism by which, when using a resonator R having a single vibration node N in the core of its material, the decoupling module, including a membrane 1 and a right hollow cylinder 2, enables the device 10 according to the invention to have an attachment area ZF which is virtually decoupled from the vibration of the resonator and is located on the external cylindrical surface of the hollow cylinder, thereby being easily accessible for positioning a system for attaching the device in a casing. This attachment system may have various configurations.

For example, FIG. 4 shows an attachment system in the form of metal supports SM, each having one end mounted on the attachment area ZF and the other end mounted on a base of the casing EB (not shown), according to the procedure used in the prior art explained in the preamble.

Also by way of example, FIGS. 5A and 5B show an attachment system integrated in the device 10 according to the invention, the mounting taking place in the same flat plate of material. The attachment system comprises a right hollow cylinder CC with substantially square directrices, surrounding and spaced apart from the hollow cylinder 2, and links of reduced thickness P positioned in the mid-plane n and rigidly connected to the external cylindrical surface of the hollow cylinder 2 and to the internal cylindrical surface of the hollow cylinder CC. One of the external bases of the hollow cylinder CC is mounted on a base of the casing EB (not shown). This attachment system is thus related to that used in the prior art explained in the preamble, and may be useful in that it protects the device 10 according to the invention from parasitic effects, due for example to heat or to the presence of an acceleration field. However, the hollow cylinder CC and the links P make no contribution to the mechanical decoupling of the vibration of the resonator. The shape of the hollow cylinder CC is therefore of little importance, and may, for example, be modelled on that of the base of the casing EB.

Reference will now be made to FIGS. 6A and 6B which show a device 20 according to a second embodiment of the invention. The device 20 comprises the aforesaid device 10; an additional right hollow cylinder 4 surrounding and spaced apart from the hollow cylinder 2 and having its central longitudinal axis and its mid-plane coinciding with those of the device 10; and an additional membrane 3 positioned in the aforementioned mid-plane and rigidly connected to the external cylindrical surface of the hollow cylinder 2 and to the internal cylindrical surface of the additional hollow cylinder 4.

The use of the device 20 may be helpful, for example if wider manufacturing tolerances are required.

The device 20 has a specific resonance mode for which the hollow cylinder 2 and the resonator R vibrate in antiphase with each other as explained above for the device 10, and the additional hollow cylinder 4 vibrates in antiphase with the hollow cylinder 2. Thus any residual radial movements which remain on the external surface of the hollow cylinder 2 close to the mid-plane, due to manufacturing defects for example, have their effects compensated by the radial deformations of the additional hollow cylinder 4 in an attachment area ZF' located on the external cylindrical surface of the additional hollow cylinder 4 close to the mid-plane, by the same mechanism as that explained for the device 10. The decoupling module of the device 20 can therefore be considered, in terms of configuration and function, as the arrangement in series of two decoupling modules as described above.

FIGS. 7A and 7B show a monolithic device according to a third embodiment of the invention. The main differences from the device 10 concern the triangular directrices of the resonator R" and of the hollow cylinder 2", and the nature of the material, the device 30 being formed in a flat plane of quartz parallel to the crystallographic plane XY, where X is the electrical axis and Y is the mechanical axis. The choice of quartz is useful if a low manufacturing cost is a decisive criterion. Thus the device 30 may be formed by combined chemical machining of a quartz plate by a method similar to that used in the clockmaking industry for manufacturing quartz crystals for watches. In most cases, chemical machining of quartz, generally carried out in a bath containing hydrofluoric acid, causes the appearance of oblique facets for which allowance must generally be made. In order to make the resonator R" produced by chemical machining resemble a right cylinder, the directrix of the cylinder must be an equilateral triangle whose sides are parallel to a mechanical axis Y. It should be borne in mind that the trigonal crystal lattice of quartz means that there are three X axes in the crystallographic plane XY, spaced at angular intervals of 120°, and three Y axes spaced at equal angular intervals of 120°. It should also be borne in mind that the chemical machining of a side parallel to the Y axis, when the material to be removed is on the negative side of the corresponding X axis, is carried out virtually perpendicularly to the plane XY until the bottom of the etch is reached, in other words with practically no oblique facets.

Thus, the resonator R" and the external cylindrical surface of the hollow cylinder 2" are right cylinders. On the other hand, the internal cylindrical surface 2" is in the shape of a truncated cone with a triangular directrix, as shown in FIG. 7B. This is not a drawback for the operation of the device 30 if this shape is allowed for in the digital simulations used to optimize the design of the device. Persons skilled in the art will understand that the expression "right cylinder", as used here, is to be considered in the wider sense, the important requirement being that the operation of the device 30 is similar to that of the device 10 described above, and that the device 30 may be attached to an attachment area ZF" located on the external surface of the hollow cylinder, this area ZF" being virtually decoupled from the vibration of the resonator.

FIGS. 8A and 8B show a device 40 according to a fourth embodiment of the invention. The main differences from the device 10 concern the square directrices of the resonator R'" and of the hollow cylinder 2'", and the non-monolithic nature of the device, as the device 40 is formed in an SOI (Silicon On Insulator) plate. More specifically, the SOI plate is formed by two identical flat plates of silicon (Si) mounted on either side of a flat plate of silica ($SiO_2$). Silicon, like silica, is a material with very low viscous damping. The mounting of the silicon and silica plates is generally based on adhesion at the atomic level, which also helps to ensure very low viscous damping. The thickness e of the silica plate is preferably less than a tenth of the thickness of each of the silicon plates, in other words less than a twentieth of the total thickness h of the SOI plate.

The device 40 is formed by plasma machining performed on both faces of the SOI plate. The machining parameters are chosen so as to ensure that the machining is selective and suitable for strong etching of silicon and weak etching of silica. Thus it is easy to control the depth of etching in order to stop the machining when it reaches the silica plate, which serves as a stop layer. Thus it is easy to form the device 40 in which the membrane 1'" is made of silica and the resonator R'" and the hollow cylinder 2'" are predominantly made of silicon.

Silicon has a cubic crystal lattice. It is therefore generally advantageous to prefer the square form for the directrices of the resonator and of the hollow cylinder, the sides of the square being parallel to the main axes of the silicon, which generally results in better operation of the device 40.

With regard to the shape of the directrices of the hollow cylinder in particular, it may be advantageous, in order to improve the operation of the device still further, to avoid using a perfect square, while still retaining a shape generally resembling a square. This has been demonstrated by the work done to optimize the geometry of the device 40 by digital simulation, the purpose of this work being to ensure that the attachment area ZF''' is virtually decoupled from the vibration of the resonator. In terms of the feasibility of manufacture, there is no particular difficulty in machining the optimal shape resulting from the digital simulations, because the machining mask used for plasma etching is made by photolithographic methods.

It should therefore be understood that the expression "square directrix" as used herein is to be interpreted in the broad sense, and more generally that the shape of the directrices of the hollow cylinder may differ substantially from that of the directrix of the resonator.

The devices according to the invention have been described mainly in terms of their mechanical behaviour.

Where the method of exciting the vibration of the resonator is concerned, various means may be used.

For example, for the quartz device 30 of triangular shape, electrodes deposited on the machined sides of the hollow cylinder may be used to generate an electrical field along the electrical axis X, this electrical field being coupled by the piezoelectric effect to the alternating compression and extension of the thickness of the wall of the hollow cylinder.

Also by way of example, for the silica devices 10 and the SOI device 40, metal sheets or mirrors placed on the faces of the resonator flush with the faces of the plate may be used to excite the vibration of the resonator by an electrostatic effect or by an optical effect such as a photothermal effect or by radiation pressure. Since these faces of the resonator are subjected to virtually no mechanical deformation, but simply an alternating translation during the vibration of the resonator, the metal sheets and mirrors do not in any way alter the quality factor of the resonator, provided that they are placed on the two faces of the resonator so as to preserve the equilibrium of the masses.

The invention claimed is:

1. A device including a resonator and a mechanical decoupling module, the resonator being formed by a right cylinder vibrating in extension/compression mode along its central longitudinal axis and having a vibration node in its mid-plane which is perpendicular to the longitudinal axis, the vibration naturally inducing radial extension/compression deformations, characterized in that the decoupling module includes a hollow right cylinder surrounding and spaced apart from the resonator and having its central longitudinal axis and its mid-plane coinciding with those of the resonator, and a membrane positioned in the mid-plane and rigidly connected to the cylindrical surface of the resonator and with the internal cylindrical surface of the hollow cylinder, and in that the hollow cylinder vibrates in extension/compression mode along its longitudinal axis in antiphase with the vibration of the resonator, as a result of which the effects of the radial deformations of the hollow cylinder and of the resonator compensate each other in an area located on the external surface of the hollow cylinder close to the mid-plane.

2. A device according to claim 1, characterized in that it comprises an additional right hollow cylinder surrounding and spaced apart from the aforesaid hollow cylinder and having its central longitudinal axis and its mid-plane coinciding with those of the resonator, and an additional membrane positioned in the aforementioned mid-plane and rigidly connected to the external cylindrical surface of the aforesaid hollow cylinder and to the internal cylindrical surface of the additional hollow cylinder, and in that the additional hollow cylinder vibrates in extension/compression mode along its longitudinal axis in antiphase with the vibration of the aforesaid hollow cylinder.

3. A device according to claim 1, characterized in that it is formed in a flat plate of material, the thickness dimension of the plate lying on the longitudinal axis of the resonator.

4. A device according to claim 3, characterized in that the device is monolithic, and in that the material is an isotropic material with very low viscous damping, such as silica, and in that the directrices of the resonator and of the hollow cylinder are circular in shape.

5. A device according to claim 3, characterized in that the device is monolithic, in that the material is quartz, the plate being parallel to the crystallographic plane XY, and in that the directrices of the resonator and of the hollow cylinder are in the shape of an equilateral triangle each of whose sides is parallel to a Y axis.

6. A device according to claim 3, characterized in that the plate is a plate of SOI, and in that the directrices of the resonator and of the hollow cylinder are in the shape of a square whose sides are parallel to the main axes of the silicon.

7. A device according to claim 2, characterized in that it is formed in a flat plate of material, the thickness dimension of the plate lying on the longitudinal axis of the resonator.

* * * * *